United States Patent [19]

Shima et al.

[11] 4,150,165

[45] Apr. 17, 1979

[54] LEAD MONOXIDE TARGET AND METHOD OF MANUFACTURING SAME

[75] Inventors: Tadao Shima; Yoshino Kajiyama; Tadafumi Hoshiyama; Youichi Kadota, all of Tokyo, Japan

[73] Assignee: Nippon Electric Co., Ltd., Tokyo, Japan

[21] Appl. No.: 802,964

[22] Filed: Jun. 2, 1977

[30] Foreign Application Priority Data

Jun. 4, 1976 [JP] Japan .................................. 51-65353
Jun. 4, 1976 [JP] Japan .................................. 51-65354

[51] Int. Cl.² .............................................. B05D 3/06
[52] U.S. Cl. ...................................... 427/39; 204/164; 427/74
[58] Field of Search .................. 313/368, 386; 427/38, 427/39, 74; 204/164

[56] References Cited

U.S. PATENT DOCUMENTS

| | | | |
|---|---|---|---|
| 3,361,919 | 1/1968 | Kiuchi et al. | 313/386 |
| 3,444,412 | 5/1969 | De Haan et al. | 427/74 |
| 3,500,099 | 3/1970 | Taylor | 427/74 |
| 3,573,097 | 3/1971 | Tsuji | 427/38 |
| 4,001,099 | 1/1977 | Wang et al. | 427/74 |

*Primary Examiner*—John H. Newsome
*Attorney, Agent, or Firm*—John M. Calimafde

[57] ABSTRACT

A target for an image pick-up tube employs a layer of lead monoxide P b O which exhibits substantially intrinsic conductivity. The surface region of the P b O layer is formed with a high energy level density effective to trap beam electrons landing thereon, while remaining in the intrinsically conductive state, by bombardment of the target surface with inert gas ions. Such a surface region effectively precludes injection of electrons into the target interior, and gives rise to improved resolution and dark current characteristics.

6 Claims, 6 Drawing Figures

LEAD MONOXIDE TARGET AND METHOD OF MANUFACTURING SAME

DISCLOSURE OF INVENTION

This invention relates to photoconductive targets for image pickup cameras, and, more particularly, to those of the type including a photoconductive layer of lead monoxide (PbO), to image pickup tubes employing such type of target; and also to methods of manufacturing such targets and image pick-up tubes.

BACKGROUND OF THE INVENTION

As is well known, dark current in a photoconductive type image pick-up tube comprises a flow of charge carriers within the photoconductive target layer in the absence of light incidence thereon, and is attributed to thermal excitation of carriers in the target material and injection of electrons from the scanning beam into the material. Where PbO is employed as a photoconductive target material, the value of dark current arising from thermal excitation at or about room temperature is almost negligible since PbO has an energy band gap of approximately 2.0 eV. Thus for a PbO target, the actual dark current is principally determined by injection of electrons into the target material from the scanning electron beam.

In this regard, it is known to form a barrier type junction or contact in the target with the intention of obtaining a photoconductive type image pick-up tube having low dark current and lag characteristics. According to this technique, a PbO target is formed with an n-i-p type barrier junction, including a transparent electrically conductive signal electrode principally comprising tin oxide deposited on a glass substrate (which electrode will be referred to hereinafter as a tin oxide layer electrode), a PbO layer adjoining the signal electrode, either one of these layers being rendered n-type conductive, another PbO layer adjoining the first PbO layer and exhibiting substantially intrinsic conductivity, and a p-type layer adjoining the second PbO layer. For details of such a target structure, reference may be had to U.S. Pat. No. 3,444,412.

In such a target structure, the p-type layer precludes injection of electrons from the scanning electron beam into the target and the n-type conductive layer precluding injection of holes from the tin oxide layer electrode into the intrinsically conductive PbO layer, so that only a dark current of limited value may arise. In other words, in this target structure, the surface region of the PbO target to be scanned by an electron beam is made p-type conductive to preclude electron injection into the target from the scanning electron beam. This may be accomplished, for example, by bombarding the target surface with oxygen ions to incorporate an excess quantity of oxygen in the surface region of the target. The surface region of the target formed in this manner, containing a substantially excessive amount of oxygen from a stoichiometric viewpoint, exhibits a distinctly increased conductivity compared with the intrinsic conductivity of the target material. Accordingly, in the p-type conductive region, lateral diffusion of carriers is increased—thus materially impairing the resolution characteristic of an image pick-up tube employing such a target.

With the intention of overcoming the encountered difficulties above-described, a target structure has been proposed in the aforementioned United States patent which has a p-type conductive layer reduced in thickness to diminish the extent of carrier diffusion leakage in such layer. In this case, however the degree of excess oxygen in the p-type conductive layer must be raised as the thickness of such layer is reduced to enable the electron barrier obtained to act effectively and stably for an extended period of time. As a consequence, the conductivity of the p-type conductive layer is not effectively suppressed as desired. This makes it difficult to improve the target resolution characteristic to any desired extent.

In addition, the proposed target structure necessarily suffers the serious disadvantage of being non-homogeneous, since it is technically difficult to form a uniform target region containing excessive oxygen over the entire target area while restricting such region within an extremely thin surface portion of the target. Any local nonuniformity in the p-type conductive layer formed in the state described above will result in a flaw in the output image of an image pick-up tube utilizing such target since at the location the i-p junction must assume a state different from that of the other junction. This obviously constitutes a serious disadvantage for such an image pick-up tube.

SUMMARY OF THE INVENTION

The present invention is intended to overcome the difficulties previously encounted as described above, and has for its primary object the provision of a PbO target of a novel structure which is free from such difficulties.

Another object of the present invention is to provide a high-resolution image pick-up tube which employs a PbO target of novel structure.

A further object of the present invention is to provide a low dark current image pick-up tube which employs a PbO target of novel structure.

Yet another object of the present invention is to provide a method of manufacturing a PbO target for an image pick-up tube which exhibits high resolution and low dark current characteristics.

According to the present invention, there is provided a PbO target which includes a transparent glass plate, a transparent electrically conductive signal electrode formed on the inside surface of the glass plate, and a PbO layer formed on the side of the signal electrode remote from the glass plate. The PbO layer comprises a first portion exhibiting substantially intrinsic conductivity, and an overlying second portion exhibiting substantially intrinsic conductivity and formed with a surface energy level density high enough to trap electrons landing on the target surface.

Also, according to the present invention, there is provided a PbO image pick-up tube which includes an envelope having an optical window at one end thereof, a target including a transparent electrically conductive signal electrode formed on the inside surface of the optical window and a photoconductive layer of PbO formed on the surface of the signal electrode, and an electron-beam gun arranged in spaced opposite relation to the target for scanning the target surface. The structure is operative to produce an electrical signal corresponding to the quantity of light focused on the target. The PbO layer of the target comprises a first portion flanked by the signal electrode and exhibiting substantially intrinsic conductivity and a second portion overlying the first portion and exhibiting substantially intrinsic conductivity, the second portion being formed with a surface energy level density high enough to trap electrons landing on the target surface, thereby effectively impeding injection of electrons into the PbO layer.

Further, according to the present invention, there is provided a PbO image pick-up tube which includes an envelope having an optical window formed at one end thereof, a target including a transparent electrically conductive signal electrode formed on the inside surface of the optical window and a photoconductive layer of PbO formed on the surface of the signal electrode remote from the optical window, and an electron-beam gun arranged in spaced opposite relation to the target for scanning the surface thereof. The PbO layer of the target consists of a substantially intrinsically conductive layer vapor-deposited in an oxygen atmosphere on the surface of the transparent electrically conductive signal electrode remote from the optical window of the envelope, and having an exposed surface region formed with a surface energy level density high enough to trap electrons landing on the target surface while remaining substantially intrinsically conductive by bombardment of the surface region with ions of an inert gas.

The present invention is based upon the principle that the surface energy level formed in the PbO layer by bombardment of inert gas ions, when observed from the viewpoint of energy band structure, is distributed within a band gap of approximately 2.0 eV width, and the Fermi level, in the case of an intrinsically conductive, vapor-deposited PbO layer, lies approximately 1 eV below the conduction band. Under such conditions, the intrinsic conductivity of the PbO layer having such a surface energy level is per se maintained, and also injection of electrons into the PbO layer is effectively precluded since those electrons emitted from the cathode of the electron gun and landing on the target surface are trapped in the surface region which is at an energy level in the vicinity of the Fermi level, and are thus unable to proceed into the interior of the target beyond the potential barrier of approximately 1 eV, relative to the conduction band of the PbO layer.

It will be recognized that according to the present invention a PbO image pick-up tube with an excellent resolution characteristic is realized because of the PbO target layer utilized, and which is capable of effectively precluding injection of electrons therein, while being held intrinsically conductive. Further, dark current in the PbO layer has a substantially reduced value due to the intrinsic conductivity of the surface region of the PbO layer.

The above and other objects, features and advantages of the present invention will become apparent from the following detailed description of the invention when taken in conjunction with the accompanying drawings, wherein:

DESCRIPTION OF THE PREFERRED EMBODIMENTS

Figure 1:
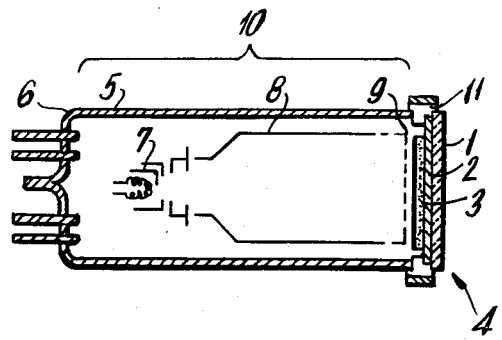
FIG. 1 comprises a diagrammatic longitudinal sectional view of an image pick-up tube embodying the present invention.

Referring now to the drawing and first to FIG. 1, which illustrates a preferred form of image pick-up tube embodying the present invention, a tube envelope 10 is provided at one end with a transparent, optical window 1 on one side of which is deposited a transparent electrically conductive signal electrode 2 in the form of a tin oxide layer (so-called nesa electrode). A photoconductive layer 3 of PbO is formed on the surface of the tin oxide layer 2 remote from the optical window 1 and forms a PbO target 4 together with the optical window 1 and tin oxide layer electrode 2. Tube envelope 10 includes a tubular body of glass 5, and a stem portion 6 formed at one end thereof and provided, as illustrated, with leads for external electrical connection. Within the envelope 10 are arranged a set of electrodes including a cathode 7, a focusing electrode 8 and a mesh electrode 9. The envelope 10 and the target 4 are hermetically welded together, as by indium 11, and the sealed assembly is evacuated to complete the image pick-up tube. Light from the subject impinges through the optical window 1 upon the target to form the image of the subject in the photoconductive layer 3. An electron beam emitting from the cathode 7 scans the inner surface of the photoconductive layer 3 to produce an electric signal in an external circuit (not shown), interconnecting the cathode 7 and the signal electrode or tin oxide layer 2, in accordance with the amount of impinging light from the subject.

Figure 2:
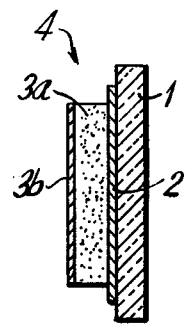
FIG. 2 is a detailed sectional view of the target shown in FIG. 1.

FIG. 2 is a detailed cross section of the target 4 which includes a major portion 3a of the vapor-deposited PbO layer 3, which is intrinsically conductive; and a surface portion 3b of the PbO layer which is intended to preclude injection of electrons into the target layer. Unlike the surface region of conventional PbO targets which is p-type conductive, the surface portion 3b is formed as a substantially intrinsically conductive layer having an appropriate surface energy level. Accordingly, the PbO layer 3b effectively precludes electron injection therein otherwise occurring in the absence of light incident thereon, while remaining substantially intrinsically conductive. As will be readily understood, with use of such a PbO target, an image pick-up tube is realizable which exhibits substantially improved resolution and a reduced dark current value.

The image pick-up tube constructed according to the present invention has a further advantage that appearance of image defects such as "white spots" deriving from any nonuniformity of the PbO layer is effectively prevented as the target in the image pick-up tube does not include any p-type conductive layer or any i-p junction which is locally impaired by the nonuniformity of the p-type layer.

The method of manufacturing the PbO target of the present invention will now be considered, together with the characteristics of an image pick-up tube employing a target fabricated by the method. The target 4 shown in FIG. 2 is obtained according to the present invention in an appropriate evaporation apparatus by the below-described process, beginning with a substrate placed in an evaporation space, i.e., a glass disc 1 which will serve as the tube optical window and having the tin oxide layer 2 deposited on one surface thereof in advance. The substrate is heated to a temperature of 60° C. to 120° C. and an atmosphere consisting mainly of oxygen is introduced into the evaporation apparatus by way of a trap specially cooled with liquid nitrogen, until a pressure of $5 \times 10^{-3}$ to $10 \times 10^{-3}$ Torr is attained. The atmosphere pressure should be held precisely at a predetermined level during the following period of evaporation. A platinum evaporation crucible is placed in the evaporation space. The crucible is specially designed to exhibit an appropriate temperature gradient when heated, as described hereinafter in more detail, and which is charged with an appropriate amount of PbO powder, principally of red tetragonal modification, having a purity of at least 99.9999%. The charge of PbO powder is melted and evaporated so that a PbO layer 3a, exhibiting intrinsic conductivity, is vapor-deposited on the tin oxide side of the substrate 1 to a thickness of approximately 15 to 20μ.

Figure 3:
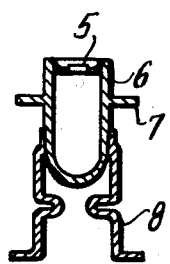
FIG. 3 is a cross-sectional elevation of an evaporation crucible made of platinum and particularly designed for use in the method of manufacturing a target according to the present invention.

One design example of the direct heating type of platinum evaporation crucible usable in vapor deposition of such an intrinsically conductive PbO layer is illustrated in FIG. 3. The body portion 6 of the crucible has a total length or height of 15 mm., an internal diameter of 8 mm. and a wall thickness of 0.3 mm. and, as shown, is provided at the top with a lid having a central opening of 4 mm. diameter. For PbO powder evaporation, the charged crucible is controllably heated to hold the open top portion thereof at a temperature at least 50° C. to 80° C. below that of the bottom portion. Such a temperature difference between the crucible top and bottom can be obtained where the crucible is directly heated by electric current means, by controlling the current which is provided at the location of two supporting posts 8 secured to the crucible body on the outside thereof. Similarly, where the crucible is heated by high-frequency induction, differential temperature control is effected at the location of an annular flange 7 secured to the outside of the crucible body 6. In the use of such evaporation vessel, it has been found that the optimum energy condition for evaporated PbO molecules to form the most intrinsically conductive PbO layer is obtained when the bottom and open top portions of the vessel are held at approximately 900° C. and 830° C., respectively.

Figure 4:
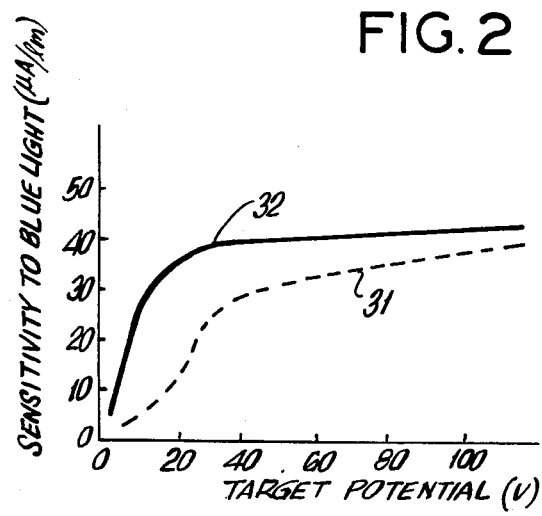
FIG. 4 is a graph indicating how spectral sensitivity to blue light is improved by annealing or slowly cooling the vapor-deposited target layer in the manufacturing method of the present invention.

Subsequent to the vapor deposition of the intrinsically conductive PbO layer on the substrate, the substrate is annealed or slowly cooled to room temperature in one to two hours while holding the atmosphere and its pressure in the evaporation space unchanged, i.e., the same as in the previous stage of vapor deposition. This step of annealing is important for the target obtained to exhibit an improved spectral sensitivity to blue light. The chart of FIG. 4 graphically illustrates the manner in which the spectral sensitivity to blue light of the target obtained is improved by the annealing process. In the FIG. 4 chart, the abscissa represents target potential in volts and, the ordinate represents spectral sensitivity to blue light in μA/lm. The broken-line curve 31 represents the target characteristic obtained with the target not subjected to annealing, while the solid line 32 represents that obtained with the target annealed. As observed from this chart, at a target potential of 30 volts, the spectral sensitivity to blue light has been nearly doubled or improved from approximately 20 μA/lm to approximately 40 μA/lm by the annealing process.

After annealing, the atmosphere in the evaporation space is replaced by an inert gas such as nitrogen or argon, which is introduced into the evaporation space until a pressure of approximately $4 \times 10^{-2}$ to $10 \times 10^{-2}$ Torr is reached therein. A D.C. or A.C. voltage of 500 to 1,000 volts is then impressed between an electrode previously provided in the evaporation apparatus and the substrate electrode to produce a glow discharge effective to form ions of the inert gas. The exposed surface of the vapor-deposited PbO layer on the substrate is bombarded with such ions for a period of 15 to 45 seconds to form an electron barrier layer 3b (FIG. 2) having a surface energy level density effective to preclude injection of electrons into the PbO layer.

To render the electron barrier layer 3b formed in this manner more effective and stable for an extended period of time, it is desirable to expose the layer to an atmosphere consisting mainly of water vapor at $5 \times 10^{-2}$ to $10 \times 10^{-2}$ Torr and at room temperature for 5 to 30 minutes and subsequently to again subject the layer to the glow discharge treatment described above. By repeating this procedure a required number of times, remarkably improved results can be obtained compared with those realized by a single glow-discharge treatment.

Several observations are made at this point. The process of forming an electron barrier layer 3b should always be terminated with a glow-discharge treatment for best results. Also, the inert gas for use in this process may be selected from a group including nitrogen, argon and helium, but use of helium is rather undesirable as it shows a strong tendency to infiltrate into the vapor-deposited film and adversely affects the film per se. In contrast, use of nitrogen gas is highly preferred. Nitrogen can conveniently be utilized as a leak gas when the vapor-deposited target unit is moved from the apparatus upon completion of the final stage of glow-discharge treatment, and also as a protecting gas required for transporting the target and its attachment to the tube envelope.

The electron barrier layer or surface region 3b of the vapor-deposited PbO layer, subjected to the glow-discharge treatment in an inert gas in the manner described, has a large number of surface energy levels formed therein. Accordingly, as will readily be noted, any electrons of the scanning beam which land on the target are trapped in such barrier layer 3b and cannot proceed into the intrinsically conductive major portion 3a of the PbO layer. Because of this, the dark current in the target formed according to the present invention is substantially reduced, compared with that in any conventional form of target. In this regard, it is to be noted that the surface region of the PbO layer vapor-deposited to exhibit substantially intrinsic conductivity substantially maintains its initial intrinsic property even after glow-discharge treatment, when viewed from a stoichiometric standpoint, though the density of energy levels in the surface region is increased by the glow-discharge treatment. There is therefore no increase in electrical conductivity of the target surface to be scanned unlike the case of targets conventionally formed with a p-type conductive surface layer. There is thus no reduction whatsoever in resolution resulting from lateral diffusion leakage of charge carriers in the target layer and, in fact, an extraordinarily high resolution is obtainable which corresponds to the extremely limited intrinsic conductivity value, approximately $10^{-15}\Omega^{-1}cm^{-1}$, of the photoconductive PbO layer.

Figure 5:
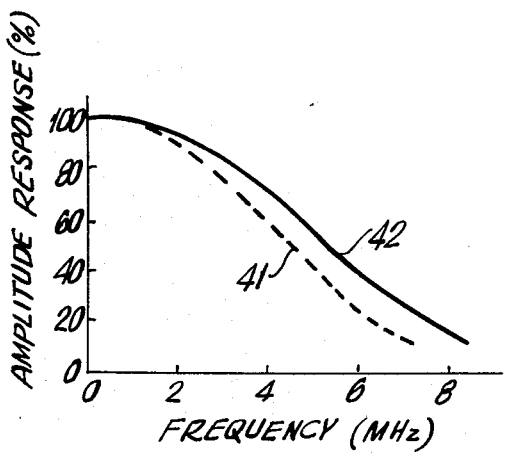
FIG. 5 is a chart indicating amplitude/space frequency response characteristic, denoting improved resolution of the image pick-up tube of the present invention.

FIG. 5 is a chart comparing the resolution characteristics of a conventional target and a target of this invention, as used in respective vidicon tubes having the same 1-inch electro-magnetic deflecting and focusing structure. In this chart, the abscissa represents space frequency of MHZ and the ordinate represents amplitude response in percent. As observed, the resolution characteristic of the target formed according to the present invention, indicated by the solid line 42, is much improved in limiting resolution and in amplitude response at a space frequency of 5 MHZ, compared with that of the conventional target having a p-type conductive layer (indicated by the broken line 41). As will be apparent, this is due to the difference in nature between the electron barrier layers formed on the surface of the respective targets scanned by an electron beam.

Figure 6:
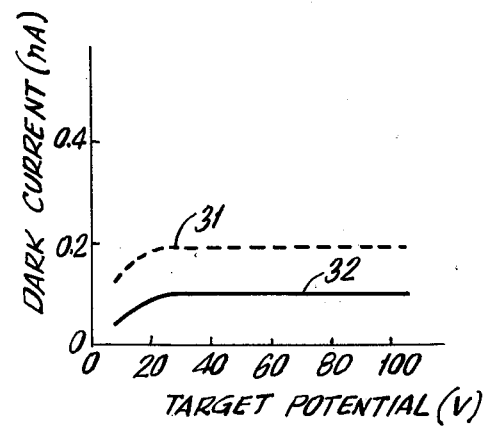
FIG. 6 is a chart indicating the dark current/target potential relationship, denoting an improved dark current characteristic of the image pick-up tube of the present invention.

FIG. 6 is a chart comparing the dark current - target potential characteristic of a conventional target having a p-type conductive surface layer formed by glow-discharge treatment in an oxygen gas with that of a target having an electron barrier layer 3b formed in the surface in accordance with the present invention. In FIG. 6, in which the abscissa represents target potential in volts and the ordinate represents dark current in nanoamperes, the broken and solid lines 31 and 32 indicate the dark current-potential characteristics of the conventional and inventive targets, respectively. An observed, the electron barrier layer 3b of the inventive target is much more effective to impede electron injection than the p-type conductive layer of the conventional target.

It will be appreciated from the foregoing description, that according to the present invention, a photoconductive PbO target is provided for an image pick-up tube which does not include formation of any p-type conductive layer; which effectively impedes injection of electrons from a scanning beam with extreme stability over an extended period of service and thus enables the image pick-up tube to exhibit much improved resolution; and which exhibits a substantially improved dark current characteristic compared with those obtainable with conventional forms of PbO target.

The above-described arrangement is merely illustrative of the principles of the present invention. Numerous modifications and adaptations thereof will be readily apparent to those skilled in the art without departing from the spirit and scope of the present invention.

What is claimed is:

1. A method of manufacturing a lead monoxide target for an image pick-up tube, comprising the steps of charging an evaporation crucible having a top opening of a diameter smaller than the inner diameter of the crucible body with a powder of lead monoxide, heating said crucible to melt and evaporate said powder of lead monoxide in an atmosphere comprising mainly oxygen gas at a reduced pressure while maintaining the open top portion of said crucible at a temperature lower than the temperature of the bottom portion of said crucible to thereby vapor-deposit a layer of lead monoxide on the surface of a substrate coated with a transparent electrically conductive electrode material, slowly cooling said layer of lead monoxide vapor-deposited on said substrate to room temperature while maintaining said atmosphere and said pressure thereof, and bombarding the free surface of said layer of lead monoxide with ions of an inert gas.

2. A method as in claim 1 wherein the open top portion of said crucible is maintained at a temperature approximately 50° C. to 80° C. lower than the temperature at the bottom portion of said crucible.

3. A method as set forth in claim 1 in which the open top portion of said crucible is held at a temperature of approximately 830° C.

4. A method as set forth in claim 1 in which said inert gas is argon.

5. A method as set forth in claim 1 in which said inert gas is nitrogen.

6. A method of manufacturing a lead monoxide target for an image pick-up tube, comprising the steps of charging an evaporation crucible having a top opening of a diameter smaller than the inner diameter of the crucible body with a powder of lead monoxide of the red tetragonal modification having a purity of not less than 99.9999 percent, heating said crucible in an atmosphere comprising mainly oxygen at a pressure of from $5\times10^{-3}$ to $10\times10^{-3}$ Torr while maintaining the temperature of the open top portion of said crucible approximately 60° C. to 80° C. below the temperature of the bottom portion of said crucible to melt and evaporate said powder of lead monoxide to thereby vapor deposit a layer of lead monoxide on the surface of a substrate coated with a transparent electrically conductive electrode material, slowly cooling said layer of lead monoxide vapor deposited on said substrate to room temperature in a period of one to two hours while maintaining said atmosphere and said pressure thereof, replacing said atmosphere by an inert gas at a pressure of from $4\times10^{-2}$ to $10\times10^{-2}$ Torr, and causing a glow discharge in said inert gas to bombard the free surface of said layer of lead monoxide with inert gas ions produced by the glow discharge.

* * * * *